United States Patent
Peters et al.

(10) Patent No.: US 8,375,267 B2
(45) Date of Patent: Feb. 12, 2013

(54) METHOD AND ARRANGEMENT FOR IMPROVED TURBO DECODING

(75) Inventors: Gunnar Peters, Stockholm (SE);
Anders Johansson, Hasselby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 313 days.

(21) Appl. No.: 12/747,608

(22) PCT Filed: Dec. 12, 2007

(86) PCT No.: PCT/SE2007/050979
§ 371 (c)(1),
(2), (4) Date: Jun. 11, 2010

(87) PCT Pub. No.: WO2009/075621
PCT Pub. Date: Jun. 18, 2009

(65) Prior Publication Data
US 2010/0275107 A1    Oct. 28, 2010

(51) Int. Cl.
*H03M 13/00*    (2006.01)
(52) U.S. Cl. ......... 714/755; 714/701; 714/752; 714/758
(58) Field of Classification Search .................. 714/701, 714/752, 755, 758
See application file for complete search history.

(56) References Cited

U.S. PATENT DOCUMENTS

| 5,761,248 | A | 6/1998 | Hagenauer et al. |
| 6,892,335 | B2 * | 5/2005 | Gueguen ................... 714/701 |
| 7,853,854 | B2 * | 12/2010 | Paumier et al. ............ 714/755 |
| 2001/0028690 | A1 | 10/2001 | Ebel, Sr. |
| 2004/0225941 | A1 | 11/2004 | Taffin |

FOREIGN PATENT DOCUMENTS

EP    0973292 A2    1/2000

OTHER PUBLICATIONS

Vogt, J. et al. "Increasing Throughput of Iterative Decoders." Electronics Letters, vol. 37, No. 12, Jun. 7, 2001, pp. 770-771.
Shibutani, A et al., "Reducing Average Number of Turbo Decoding Iterations", Electronics Letters, Apr. 29, 1999, vol. 35, No. 9, pp. 701-702, IEE Stevenage, GB.

* cited by examiner

*Primary Examiner* — Sam Rizk
(74) *Attorney, Agent, or Firm* — Coats & Bennett, P.L.L.C.

(57) ABSTRACT

In a method for improved turbo decoding in a wireless communication system, jointly allocating (S10) a predetermined maximum number of decoding iterations to a batch of received decoding jobs; and consecutively performing decoding iterations (S20) adaptively for each job in the batch until a convergence criteria is reached for each job in the batch, or until the predetermined maximum number of iterations for the batch is reached.

20 Claims, 3 Drawing Sheets

METHOD AND ARRANGEMENT FOR IMPROVED TURBO DECODING

TECHNICAL FIELD

The present invention relates to telecommunication system in general, specifically to method and arrangements enabling improved turbo decoding in such systems.

BACKGROUND

A turbo decoder improves soft values through an iterative procedure. Either it can be run with a fixed number of iterations, or adaptive stop criteria can be used to decide when the process has converged. In order to decode a frame e.g. a block of data, the turbo decoder performs several iterations. For the first iteration, it assumes that the probabilities of 0 and 1 are equal and based on the channel information bits it produces a soft decision output for each data bit. For other iterations, the decoder will use the soft output of the other decoder as a priori probability to perform the next iteration.

Even if a turbo decoder algorithm predicts an average number of iterations N for a frame or job many more may be needed in the worst case, e.g. during a fading dip. If a fixed number of iterations is used, this fixed number has to correspond to the worst case, but even if an adaptive stop algorithm is used the hardware has to be dimensioned for the number of iterations needed in the worst case.

Due to a finite number of resources, the allowed number of iterations must be limited. This number will in the following disclosure be denoted the maximum number of iterations.

Many criteria for adaptive stop are known in prior art. Either the quality of the soft values, or the convergence of hard decisions based on the soft values can be used.

In a WCDMA system with power control, the system tries to control the transmit power in such a way that a certain block error rate (BLER) target is obtained. If the turbo decoder is allowed to always converge, the BLER will be very small and the power control loop will not work. Using e.g. a maximum number of iterations ensures that, depending on the C/I, the BLER is not always equal to zero. If, however, for an adaptive stop algorithm the maximum number of iterations is set per user, it will be equal to the number of iterations needed in the worst case.

The average number of iterations needed for a turbo decoder job to converge depends on the coding scheme used and the requirement on the carrier over interference power ratio (C/I) expected by the receiver. In general, this can be expressed by saying that the average number of iterations depends on the service type.

Even with an adaptive stop criterion with an average number of iterations equal to N is used, many more iterations might be needed in the worst case. If a maximum number of iterations per user is used, then this maximum number will be equal to the number of iterations used in a fixed number of iterations algorithms, and the adaptive stop cannot be used to save resources.

To avoid momentary overload, on a digital signal processor (DSP) or any other type of platform implementing a receiver, more resources than corresponds to the average number of iteration per user need to be allocated. These resources will not be fully utilized. In certain cases, more than 100% more resources than is needed on average, have to be allocated. This has a severe impact on the capacity of the receiver.

Therefore, there is a need for methods and arrangements for improved Turbo decoding.

SUMMARY

Teachings herein advantageously include a method for improved turbo decoding in a wireless communication system. The method entails jointly allocating predetermined maximum number of decoding iterations to a batch of received decoding jobs; and consecutively performing decoding iterations (adaptively for each job in said batch until a convergence criteria is reached for each job in the batch, or until said predetermined maximum number of iterations for the batch is reached.

By using the result of an adaptive stop algorithm to pool the turbo iterations between several decoder jobs, the method advantageously reduces the turbo processing and the number of allocated turbo resources.

BRIEF DESCRIPTION OF THE DRAWINGS

The invention, together with further objects and advantages thereof, may best be understood by referring to the following description taken together with the accompanying drawings, in which.

ABBREVIATIONS

3GPP 3'd Generation Partnership Project
BLER BLock Error Rate
C/I Carrier over Interference power ratio
DSP Digital Signal Processor
SIR target Signal over Interference Ratio target
UMTS Universal Mobile Terrestrial System
WCDMA Wideband Code Division Multiple Access

DETAILED DESCRIPTION

The present invention will be discussed in the context of a general wireless communication network where a plurality of decoding jobs from multiple users are received consecutively at a decoder arrangement. The users and or jobs may have various associated service type requirements.

Figure 1:
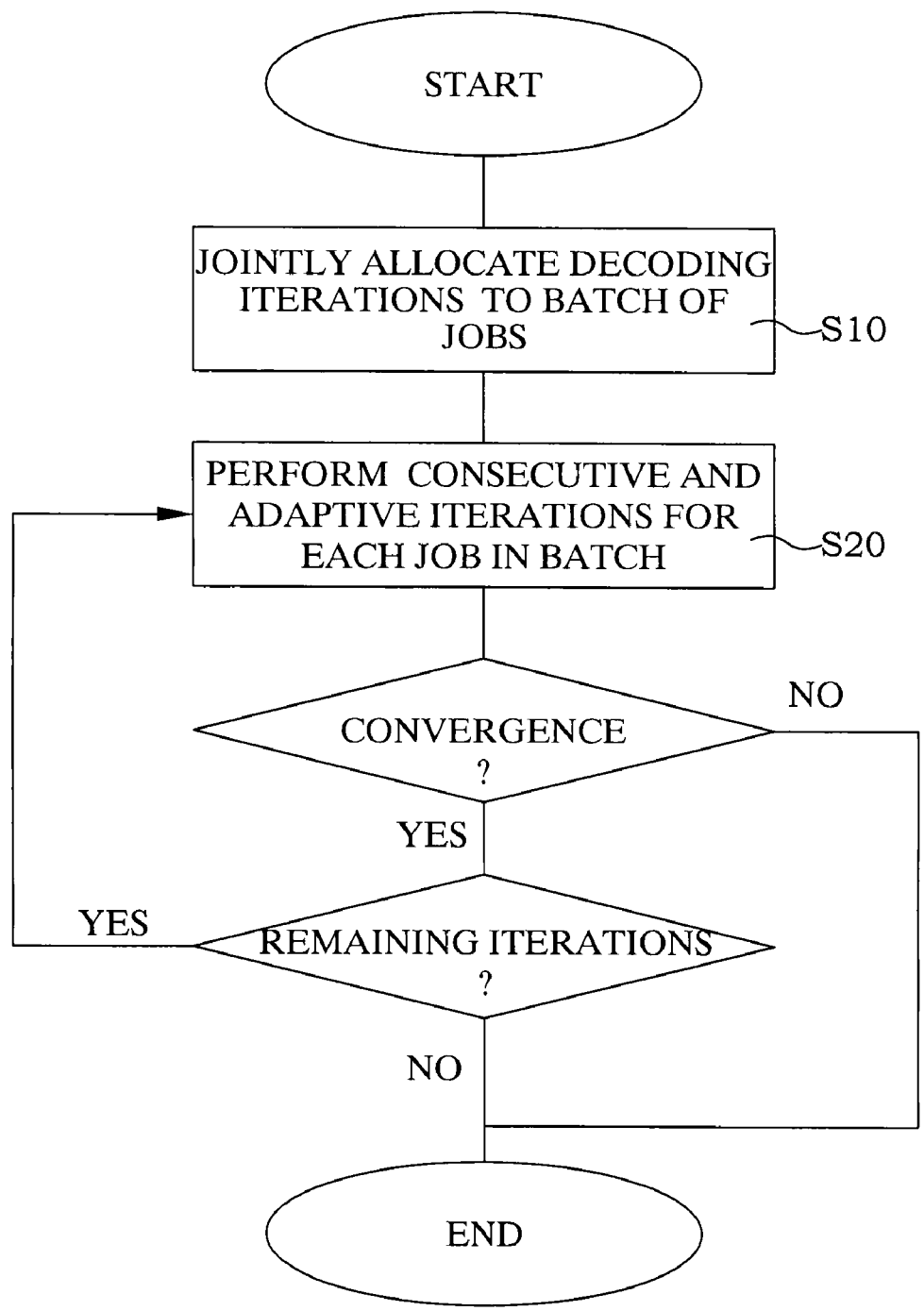
FIG. 1 is a schematic flow chart of an embodiment of the method of the present invention.
Figure 2:
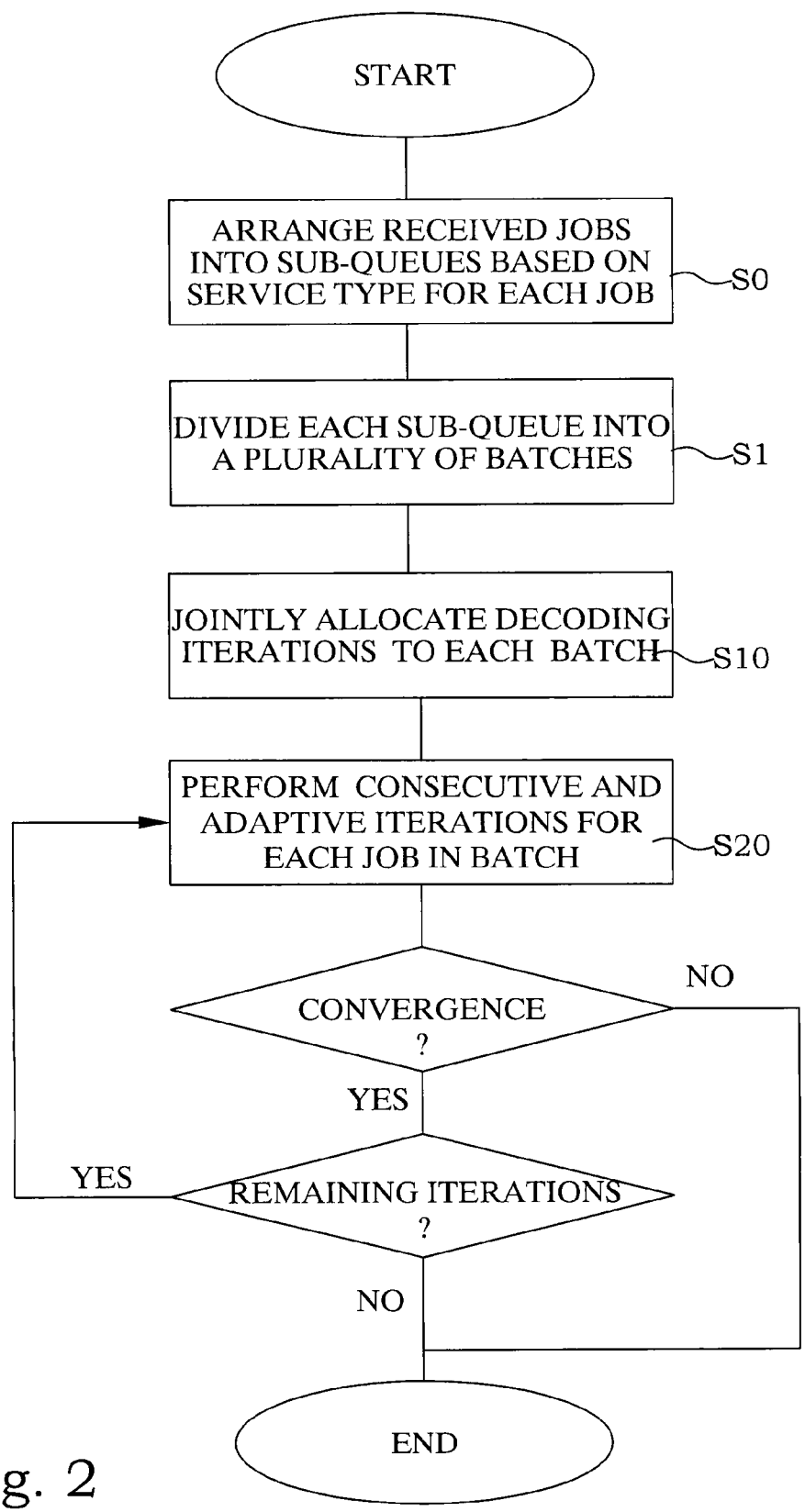
FIG. 2 is a schematic flow chart of a further embodiment of the method of the present invention.

With reference to FIG. 1, an embodiment of the present invention will be described below.

This embodiment enables a number of available turbo iterations to be shared between several decoder jobs, for a given service type. This in turn enables a significant reduction in the total maximum number of iterations needed, and less Turbo decoder resources need to be allocated.

Basically, a subgroup or batch of received turbo decoder jobs are allocated S10 a predetermined maximum number of decoding iterations. Subsequently, in consecutive reception order or some other predetermined order, the jobs in the subgroup or batch are subjected to an adaptive number of decoding iterations S20, in which a first job in the batch is allocated the predetermined maximum number of decoding iterations. The iterations are continued either until the job fulfills a convergence criterion or until the predetermined number of iterations is used up.

If the convergence criterion is fulfilled, and there are still remaining allocated iterations, the next consecutive job in the subgroup or batch is processed. If a job has not converged before the allocated number of decoding iterations have been consumed, the job is declared as having a block error. Similarly, any remaining job in the subgroup is also declared as having a block error. In other words, the remaining jobs are not allowed access to the decoding resource. Instead, the method according to the disclosure moves on to a next subgroup of decoding jobs and repeats the above described process.

Below, a further embodiment and description of the invention is disclosed. Consider a turbo decoder resource, and let $$Q=(J_1, J_2, J_3, J_4, J_5; \ldots)$$

where Q is a master queue of turbo decoding jobs J for this resource. The queued jobs will be subjected to the decoding process in consecutive order, e.g. job $J_1$ will be served first, job $J_2$ next and so on. The order of the jobs within the master queue is determined by e.g. the order in which they arrive to the resource, timing constraints, and any associated priorities of the respective jobs. Also, other factors can be taken into consideration, which will be further described below.

Next, for a given service type $S_i$ form a sub-queue $Q_i$ in step S0

$$Q_i=(J_{k_1}, J_{k_2}, J_{k_3}, J_{k_5}, J_{k_6}; \ldots) k_1 \leq k_2 \leq k_3 \ldots$$

consisting of all jobs in the previously described master queue Q with the specific service type $S_i$. Note that the service type can be distinguished by coding scheme, BLER target, required C/I for the BLER target, and the average number of iterations $N_i$ needed for convergence at the given C/I. The skilled person realizes that also other factors determined the service type of each specific job.

The service queue or sub queue $Q_i$ is divided, in step S1, into a plurality of consecutive batches of $D_i$ number of jobs. A predetermined number $M_i$ of decoding iterations per job is determined.

Note that a specific user might have zero, one or several jobs in the same batch. In the extreme case of only one user with service type $S_i$, all jobs in $Q_i$ are from this user. Note that the different sub queues, corresponding to different service types, are preferably interleaved in time according to the ordering given by the master queue Q.

Subsequently, consider only one of the sub-queues $Q_i$. All the jobs in one batch of length $D_i$ will share $M_i \cdot D_i$ iterations, in a sense that no job in this batch will be stopped before it has converged, or a total of $M_i \cdot D_i$ have been used for all jobs in the batch.

If all the $M_i \cdot D_i$ iterations have been used before the end of the batch, the remaining turbo jobs are thrown away and the data is lost. If the end of the batch is reached before all the iterations are used, then the next batch is considered.

Note that at one specific time there might not be enough jobs to fill one batch of length $D_i$. In this case the $M_i \cdot D_i$ iterations will be shared with future jobs until $D_i$ jobs have been processed.

It can be shown, from simulations, that $M_i \approx N_i$ or even $M_i \leq N_i$ is sufficient, where $N_i$ is an average number of iterations per job for a certain service type $S_i$. In this way, only resources corresponding to at most $N_i$ iterations per job need to be allocated.

Some embodiments of the present invention include an algorithm according to the following:

Consider only one of the sub queues $Q_i$, the queue is divide into a plurality of batches each comprising $D_i$ number of jobs. Let $K_i$ denote the remaining number of iterations for the jobs in a batch.

1. When the first job in a batch arrives to the Turbo decoding resource, then set $K_i = M_i \cdot D_i$.
2. When a job arrives to the resource, then set the maximum number of iterations for this job equal to $K_i$, and run the job. Let $L_i$ be the actual number of iterations used for the job.
3. After a job has run on the resource set $K_i = K_i - L_i$. If $K_i$ becomes equal to zero, then all the following jobs in the batch is declared to have a block error, and are not allowed access to the resource.
4. If a turbo decoder job does not converge in the allowed maximum number of iterations, then it is declared to have a block error.

One aspect that needs further attention is the fact that by decoding the jobs within a batch consecutively and potentially discarding the remaining jobs in a batch, some users may always end up in the end of a batch and thereby be discarded frequently.

According to a specific embodiment of the present invention, the jobs associated with different users are permutated at the decoding resource, thereby preventing the same user from always ending up at the end of a batch. A further potential remedy is to ensure that the length of the sub-queue is shorter than the number of users, or at least does not have a common factor with the number of users.

Figure 3:
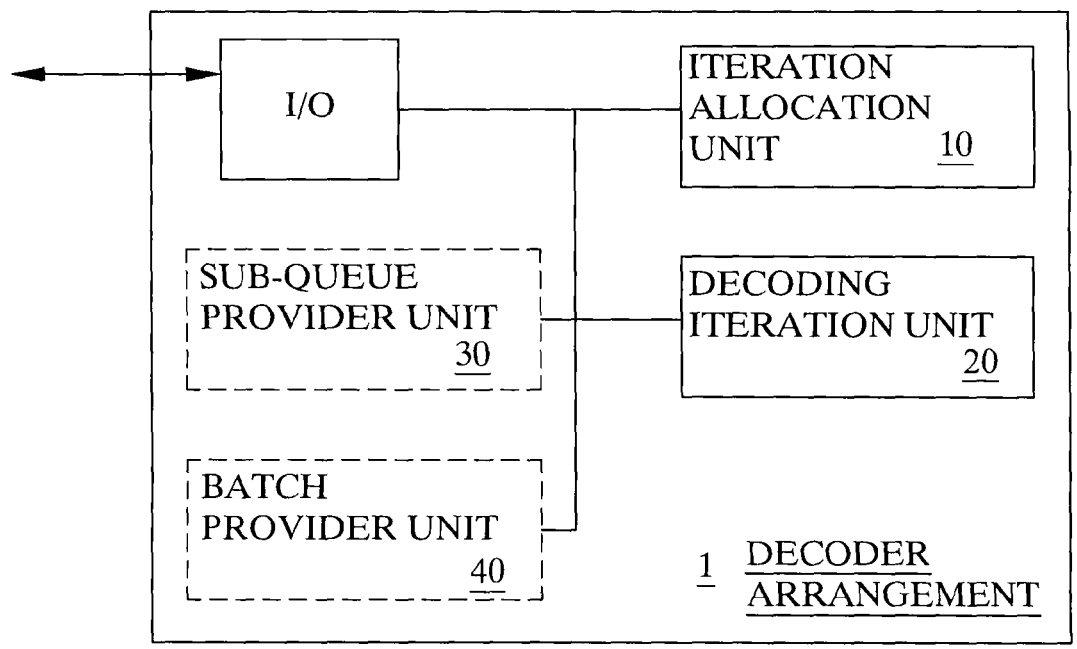
FIG. 3 is a schematic block schedule of an embodiment of an arrangement according to the present invention.

With reference to FIG. 3, an arrangement according to an embodiment of the present invention will be described.

The decoder arrangement 1 includes, in addition to any conventional and known units for reception and decoding received jobs, a unit 10 (i.e., an allocation circuit) adapted for allocating a predetermined maximum number of decoder iterations to a batch of received decoder jobs, and a unit 20 (i.e., a decoding circuit) adapted for performing consecutive and adaptive decoding iterations to the jobs within each batch based on the allocated predetermined maximum number of decoder iterations. The unit 20 is further adapted to perform the decoder iterations for each job until a convergence criterion is met, or until the allocated number of decoder iterations for the batch have been consumed.

According to a further embodiment, also referring to Fig. 3, the arrangement 1 also includes a sub-queue unit (i.e., circuit) 30 adapted for dividing a received plurality of decoder jobs into sub-groups or sub-queues based on service type. In other words, each sub-queue comprises jobs with a certain service type. In addition, the arrangement 1 includes a batch provider unit (i.e., circuit) 40 adapted to further divide each sub-queue into a plurality of batches, each batch comprising less than or up to a set number of decoding jobs.

Figure 4:
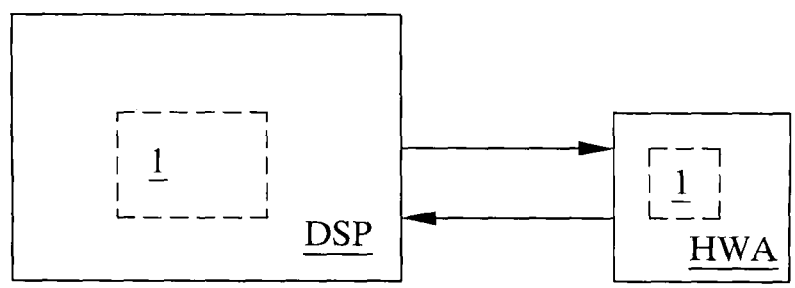
FIG. 4 is a further schematic block schedule of an embodiment of an arrangement according to the present invention.

The arrangement according to the invention can be implemented as hardware in a hardware accelerator HWA which is in communication with a digital signal processor DSP. It is equally applicable that the arrangement is implemented as software in a DSP. Both embodiments are indicated by the dotted boxes in FIG. 4.

Various embodiments described above provide several advantages.

For example, let Ni be the average number of Turbo iterations needed for a certain service Si. According to these embodiments, the full gain of using approximately Ni iterations per job can be obtained.

Furthermore, by using the result of an adaptive stop algorithm to pool the turbo iterations between several decoder jobs, the embodiments reduce the turbo processing and the number of allocated turbo resources.

The invention claimed is:

1. A method for improved turbo decoding in a wireless communication system, the method comprising:
   jointly allocating a predetermined maximum number of decoding iterations to a batch of received decoding jobs; and
   consecutively decoding the jobs in said batch and performing an adaptive number of decoding iterations for each job, by, for any given job, performing decoding iterations until a convergence criterion for that job is reached, or until said predetermined maximum number of iterations for the batch is exhausted, and subsequently applying any decoding iterations not exhausted from said predetermined maximum number of decoding iterations to a consecutive job in said batch.

2. The method of claim 1, further comprising, when said predetermined maximum number of iterations for the batch has been exhausted, identifying any remaining consecutive jobs in the batch as having block errors.

3. The method of claim 2, further comprising discarding jobs identified as having a block error.

4. The method of claim 1, further comprising, if the predetermined maximum number of iterations for the batch has been exhausted but the convergence criterion for a current job has not been reached, identifying that job as having a block error.

5. The method of claim 4, further comprising discarding jobs identified as having a block error.

6. The method of claim 1, further comprising:
   initially arranging a plurality of received decoding jobs into a plurality of sub-queues based on service type;
   dividing each sub-queue into a plurality of consecutive batches, each batch comprising a predetermined number of decoding jobs; and
   allocating a predetermined maximum number of decoding iterations to each batch in each sub-queue, the predetermined maximum number allocated to a batch in any given sub-queue depending on the service type associated with that sub-queue.

7. The method of claim 6, wherein a service type is defined by one of or a combination of coding scheme, block error rate (BLER) target, required carrier-to-interference ratio (C/I) for the BLER target, and average number of iterations needed for convergence at a required C/I.

8. The method of claim 6, wherein said predetermined number of decoding iterations for a service type is based on an average number of iterations for that service type.

9. The method of claim 6, further comprising, for each sub-queue, determining the order of said batches for consecutive decoding based on a respective user associated with each job.

10. An apparatus for improved turbo decoding in a wireless communication system, the apparatus comprising:
    an allocation circuit configured to jointly allocate a predetermined number of decoding iterations to batch of received decoding jobs; and
    a decoding circuit configured to consecutively decode the jobs in said batch and perform an adaptive number of decoding iterations for each job, by, for any given job, performing decoding iterations until a convergence criterion for that job is reached, or until said predetermined maximum number of iterations for the batch is exhausted, and subsequently applying any decoding iterations not exhausted from said predetermined maximum number of decoding iterations to a consecutive job in said batch.

11. The apparatus of claim 10, wherein the apparatus is provided in a digital signal processor (DSP).

12. The apparatus of claim 10, wherein the apparatus is provided in a hardware accelerator (HWA).

13. The apparatus of claim 10, wherein the apparatus comprises a turbo decoder.

14. The apparatus of claim 10, wherein the decoding circuit is further configured to, when said predetermined maximum number of iterations for the batch has been exhausted, identify any remaining consecutive jobs in the batch as having block errors.

15. The apparatus of claim 14, wherein the decoding circuit is further configured to discard jobs identified as having a block error.

16. The apparatus of claim 10, wherein the decoding circuit is further configured to, if the predetermined maximum number of iterations for the batch has been exhausted but the convergence criterion for a current job has not been reached, identify that job as having a block error.

17. The apparatus of claim 10, further comprising:
    a sub-queue circuit configured to initially arrange a plurality of received decoding jobs into a plurality of sub-queues based on service type; and
    a batch provider circuit configured to divide each sub-queue into a plurality of consecutive batches, each batch comprising a predetermined number of decoding jobs; and
    wherein the allocating circuit is further configured to allocate a predetermined maximum number of decoding iterations to each batch in each sub-queue, the predetermined maximum number allocated to a batch in any given sub-queue depending on the service type associated with that sub-queue.

18. The apparatus of claim 17, wherein a service type is defined by one of or a combination of coding scheme, block error rate (BLER) target, required carrier-to-interference ratio (C/I) for the BLER target, and average number of iterations needed for convergence at a required C/I.

19. The apparatus of claim 17, wherein said predetermined number of decoding iterations for a service type is based on an average number of iterations for that service type.

20. The apparatus of claim 17, wherein the decoding circuit is configured to, for each sub-queue, determine the order of said batches for consecutive decoding based on a respective user associated with each job.

* * * * *

UNITED STATES PATENT AND TRADEMARK OFFICE
CERTIFICATE OF CORRECTION

PATENT NO. : 8,375,267 B2  Page 1 of 1
APPLICATION NO. : 12/747608
DATED : February 12, 2013
INVENTOR(S) : Peters et al.

It is certified that error appears in the above-identified patent and that said Letters Patent is hereby corrected as shown below:

On the Title Page, item (75), under "Inventors", in Column 1, Line 2, delete "Hasselby (SE)" and insert -- Hässelby (SE) --, therefor.

In the Specifications:

In Column 2, Line 8, delete "predetermined" and insert -- a predetermined --, therefor.

In Column 2, Line 11, delete "(adaptively" and insert -- adaptively --, therefor.

In Column 3, Line 30, delete "$k_1 \leqq k_2 \leqq k_3...$" and insert -- $k_1 < k_2 < k_3...$ --, therefor.

In Column 4, below Line 67, insert -- It will be understood by those skilled in the art that various modifications and changes maybe made to the present invention without departure from the scope thereof, which is defined by the appended claims. --, as a new paragraph.

Signed and Sealed this
Eleventh Day of June, 2013

Teresa Stanek Rea
*Acting Director of the United States Patent and Trademark Office*